(12) United States Patent
Beciu et al.

(10) Patent No.: US 11,791,755 B2
(45) Date of Patent: Oct. 17, 2023

(54) METHOD FOR ESTIMATING THE POSITION OF A ROTOR OF A SYNCHRONOUS ELECTRICAL MACHINE

(71) Applicant: THALES, Courbevoie (FR)

(72) Inventors: Andreea-Livia Beciu, Chatou (FR); Amira Maalouf, Chatou (FR)

(73) Assignee: THALES, Courbevoie (FR)

( * ) Notice: Subject to any disclaimer, the term of this patent is extended or adjusted under 35 U.S.C. 154(b) by 0 days.

(21) Appl. No.: 17/529,167

(22) Filed: Nov. 17, 2021

(65) Prior Publication Data
US 2022/0158577 A1 May 19, 2022

(30) Foreign Application Priority Data

Nov. 19, 2020 (FR) ...................... 2011885

(51) Int. Cl.
*H02P 21/18* (2016.01)
*H02P 21/22* (2016.01)
(Continued)

(52) U.S. Cl.
CPC .............. *H02P 21/18* (2016.02); *H02P 21/13* (2013.01); *H02P 21/22* (2016.02);
(Continued)

(58) Field of Classification Search
CPC ...... H03H 17/0202; H02K 5/132; H02P 6/08; H02P 1/426; H02P 9/44; H02P 21/09; H02P 25/024; H02P 27/04
See application file for complete search history.

(56) References Cited

FOREIGN PATENT DOCUMENTS

| CN | 106059430 A | * 10/2016 |
|---|---|---|
| CN | 106959430 A | 7/2017 |

(Continued)

OTHER PUBLICATIONS

H. Li, X. Zhang, S. Yang, F. Li and M. Ma, "Improved initial rotor position estimation of IPMSM using amplitude demodulation method based on HF carrier signal injection," IECON 2017—43rd Annual Conference of the IEEE Industrial Electronics Society, Beijing, China, 2017, pp. 1996-2001, (Year: 2017).*

(Continued)

*Primary Examiner* — Said Bouziane
(74) *Attorney, Agent, or Firm* — BakerHostetler

(57) ABSTRACT

A method for estimating the position of a rotor of a synchronous electrical machine, includes a rotor and a stator coupled to an inverted synchronous electrical machine via a rectifier comprising the following steps: measurement of a current $i_{abc}$ circulating in the stator of the synchronous electrical machine; determination of two signals in quadrature $i_\alpha$; $i_\beta$ according to a stationary reference frame from the current $i_{abc}$ and isolation of two filtered signals $i_{\alpha h}$; $i_{\beta h}$ from the two signals in quadrature $i_\alpha$; $i_\beta$; demodulation of the two filtered signals $i_{\alpha h}$; $i_{\beta h}$ in order to obtain two demodulated signals $i_{\alpha obs}$, $i_{\beta obs}$; obtaining of an estimated position $\hat{\theta}$ of the rotor from the two demodulated signals $i_{\alpha obs}$, $i_{\beta obs}$.

13 Claims, 7 Drawing Sheets

(51) Int. Cl.
  *H02P 21/13*   (2006.01)
  *H03H 17/02*   (2006.01)
(52) U.S. Cl.
  CPC ..... *H03H 17/0202* (2013.01); *H02P 2207/05* (2013.01); *H03H 2017/0205* (2013.01)

(56) References Cited

FOREIGN PATENT DOCUMENTS

CN  107134962 A  9/2017
WO  WO-2011126462 A1 * 10/2011  ............. G01D 5/243

* cited by examiner

METHOD FOR ESTIMATING THE POSITION OF A ROTOR OF A SYNCHRONOUS ELECTRICAL MACHINE

CROSS-REFERENCE TO RELATED APPLICATIONS

This application claims priority to foreign French patent application No. FR 2011885, filed on Nov. 19, 2020, the disclosure of which is incorporated by reference in its entirety.

FIELD OF THE INVENTION

The invention relates to the control of rotating electrical machines. More particularly, the invention relates to a method that makes it possible to estimate the position of a rotor of a rotating electrical machine. The invention is particularly suited to estimating the position of a rotor of a rotating electrical machine operating at low speed or when stopped. The invention is of particular use in the field of rotating machines operating without mechanical sensors for sensing the position of the rotor as in the field of aeronautics where the current trend is to limit the embedded weight in aeroplanes.

BACKGROUND

The rotating electrical machines of brushless synchronous machine type and with multiple stages are used on a large scale in the aeronautical field. For example, they can be used in order to provide a strong torque in the start-up phases of the engines with which they are associated.

These new motorisation systems require the knowledge, at any moment, of the position of the rotor for efficient commands to be generated. Now, according to the architecture of the systems that use mechanical sensors, the location of these machines in proximity to the engine represents an extremely severe constraint demanding mechanical sensors operating in an environment raised to very high temperature. Thus, the use of mechanical sensors under these extreme constraints becomes a constraint for the design.

Moreover, depending on the types of synchronous machines used, the mechanical integration of the rotor position sensor on the machine can be a real problem. In fact, the compactness of the current synchronous machines desired by aircraft manufacturers curbs the insertion of such sensors.

This is all the more true since dispensing with a mechanical position sensor allows for a weight saving linked to the elimination of the sensor and to the reduction of the number of cables between the electronic used in startup and the rotating electrical machine.

At very low speed and when stopped, techniques can be used to estimate the position of a synchronous electrical machine. Among these techniques, the injection of signals at high frequency into the stator or at the rotor makes it possible to induce a current response which depends on the real position of the rotor.

The methods involving the injection of signals at high frequency into the stator are usually employed for the estimation of the position of the rotor but they have drawbacks:

the injection of the signals at high frequency can produce a disturbance in the electromagnetic torque of the rotating electrical machine, without the amplitude of the useful current containing the position information being sufficient for the processing of that datum.

The harmonics produced at high frequency do not contain information on the real polarity of the rotor. A special polarity identification sequence is thus necessary.

The injection of signals at high frequency on the stator therefore presents drawbacks in the case of the estimation of the position of the rotor.

Conversely, the injection of signals at high frequency on the rotor can be envisaged because it allows for an estimation of the position from a current induced in the stator which contains the information on the position without uncertainty concerning the polarity. Furthermore, the set of harmonics induced on the stator has a low amplitude for the same quantity of signals injected compared to any injection method on the stator, which means less significant disturbances. However, some elements, such as, for example, the rectifier bridges, make it difficult to inject a signal directly on the rotor.

The documents CN 106959430 A and CN 107134962 A thus propose a method for estimating the position of the rotor.

SUMMARY OF THE INVENTION

The invention aims to wholly or partly overcome the problems cited above by proposing a method for estimating the position of a rotor from the stator current of a rotating electrical machine via harmonics that exist naturally in the stator current of the rotating electrical machine. This estimation is therefore obtained without greatly modifying the existing system and without the injection of additional signals either on the rotor, or on the stator, which could introduce torque disturbances. An analysis of the stator currents makes it possible to estimate the position directly without uncertainty concerning the polarity and without adding additional measurements.

Thus, the position estimation is made robust in the context of a more electrical aeroplane. The invention makes it possible to enhance the reliability of the overall system, which represents a major benefit, by way of example, in the field of aeronautics where the avionics systems need to be as reliable as possible.

To this end, the subject of the invention is a method for estimating the position of a rotor of a synchronous electrical machine, comprising a rotor and a stator coupled to an inverted synchronous electrical machine via a rectifier comprising the following steps:

a) measurement of a current $i_{abc}$ circulating in the stator of the synchronous electrical machine;

b) determination of two signals in quadrature $i_\alpha$; $i_\beta$ according to a stationary reference frame from the current $i_{abc}$ and isolation of two filtered signals $i_{\alpha h}$; $i_{\beta h}$ from the two signals in quadrature $i_\alpha$; $i_\beta$;

c) demodulation of the two filtered signals $i_{\alpha h}$; $i_{\beta h}$ in order to obtain two demodulated signals $i_{\alpha obs}$, $i_{\beta obs}$;

d) obtaining of an estimated position $\hat{\theta}$ of the rotor from the two demodulated signals $i_{\alpha obs}$, $i_{\beta obs}$.

According to an aspect of the invention, the estimated position $\hat{\theta}$ estimated in the step d is made according to the following mathematical expression:

$$\hat{\theta} = \mathrm{atan}\left(\frac{i_{\beta obs}}{i_{\alpha obs}}\right)$$

According to an aspect of the invention, the estimated position $\hat{\theta}$ estimated in the step d is made using an observer.

According to an aspect of the invention, the two filtered signals $i_{\alpha h}$; $i_{\beta h}$ have a frequency combining an operating frequency of the inverted synchronous electrical machine and a frequency of the synchronous electrical machine.

According to an aspect of the invention, the isolation of the two filtered signals $i_{\alpha h}$; $i_{\beta h}$ from the two signals in quadrature $i_\alpha$; $i_\beta$ is performed using a bandpass filter or a high-pass filter.

According to an aspect of the invention, the step of demodulation of the two filtered signals $i_{\alpha h}$; $i_{\beta h}$ uses a measurement of a current $i_{ex}$ of the stator of the inverted synchronous electrical machine.

According to an aspect of the invention, the estimation method comprises a step of filtering of the two demodulated signals $i_{\alpha obs}$, $i_{\beta obs}$ between the step c and the step d, the filtering step being performed using a bandpass filter or an extended Kalman filter.

According to an aspect of the invention, the estimation method comprises a step of estimation of the speed $\hat{\theta}$ of the rotor of the synchronous electrical machine from the estimated position $\hat{\theta}$ of the rotor of the synchronous electrical machine.

According to an aspect of the invention, the estimation method comprises a step of correction of the estimated position $\hat{\theta}$ with the following mathematical formula:

$$\hat{\theta}_{corr} = \hat{\theta} + \hat{\phi}_{corr}$$

in which $\hat{\phi}_{corr}$ is a correction of the delays on the estimation of the position and $\hat{\theta}_{corr}$ is a corrected position of the rotor of the synchronous electrical machine.

According to an aspect of the invention, the correction of the delays $\hat{\phi}_{corr}$ is the sum of a phase-shift correction of the filters used $\hat{\phi}_F$ in the estimation method and of a phase-shift correction dependent on the electromagnetic characteristics of the synchronous electrical machine $\hat{\phi}_{LC}$.

According to an aspect of the invention, the estimation method can be repeated periodically, and the demodulation step is preceded by a step of evaluation of a phase $\hat{\phi}$ of a carrier from the filtered signals $i_{\alpha h}$; $i_{\beta h}$, of an angular frequency $\omega_{ex}$ of the inverted synchronous electrical machine and of the estimated position $\hat{\theta}$ in a preceding iteration of the estimation method, the carrier being obtained at the rotor of the inverted synchronous electrical machine.

Similarly, the subject of the invention is a device for estimating the position of a rotor of a synchronous electrical machine coupled to an inverted synchronous electrical machine via a rectifier for operation when stopped or at low speed comprising:

a module for measuring a current $i_{abc}$ circulating in the stator of the synchronous electrical machine;

a module for determining and isolating harmonics of two filtered signals $i_{\alpha h}$; $i_{\beta h}$ from the current $i_{abc}$;

a module for demodulating the two filtered signals $i_{\alpha h}$; $i_{\beta h}$ from a measurement of the current $i_{ex}$ of the stator of the inverted synchronous electrical machine or of a carrier of angular frequency co of the inverted synchronous electrical machine in order to obtain two demodulated signals $i_{\alpha obs}$, $i_{\beta obs}$;

an obtaining module configured to determine an estimated position $\hat{\theta}$ of the rotor of the synchronous electrical machine from the two demodulated signals $i_{\alpha obs}$, $i_{\beta obs}$.

According to an aspect of the invention, an electrical machine comprises an inverted electrical machine and at least one synchronous electrical machine equipped with the estimation device.

BRIEF DESCRIPTION OF THE DRAWINGS

The invention will be better understood and other advantages will become apparent on reading the detailed description of an embodiment given by way of example, the description being illustrated by the attached drawing in which.

In the interests of clarity, the same elements will bear the same references in the different figures.

DETAILED DESCRIPTION

The term "main machine" designates any synchronous rotating electrical machine, provided or not provided with one or more dampers. The term "exciter" designates any synchronous rotating electrical machine that is inverted with respect to the main machine. The exciter is connected to the main machine by a rotating diode bridge also called current rectifier that makes it possible to obtain a direct current from an alternating current.

Figure 1A:
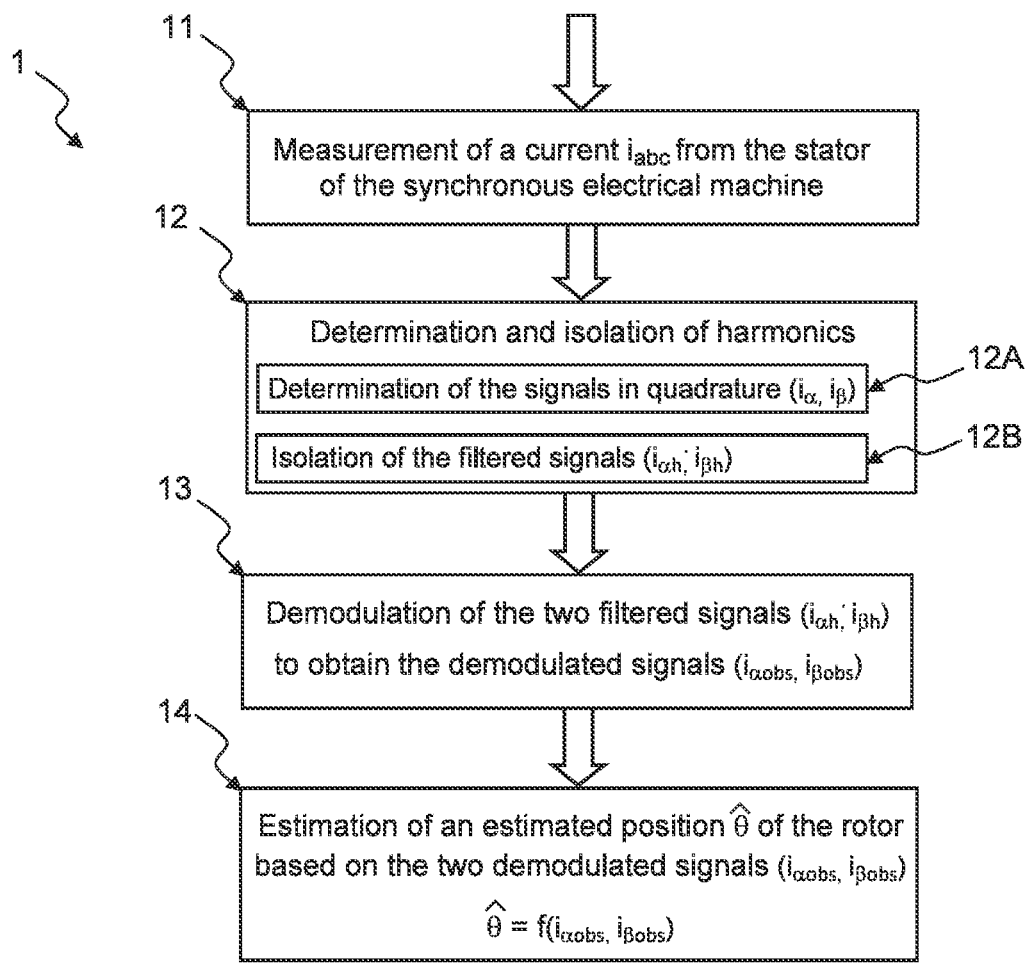
FIG. 1A schematically illustrates a method for estimating the position of a rotor of a rotating electrical machine according to the invention.
Figure 1B:
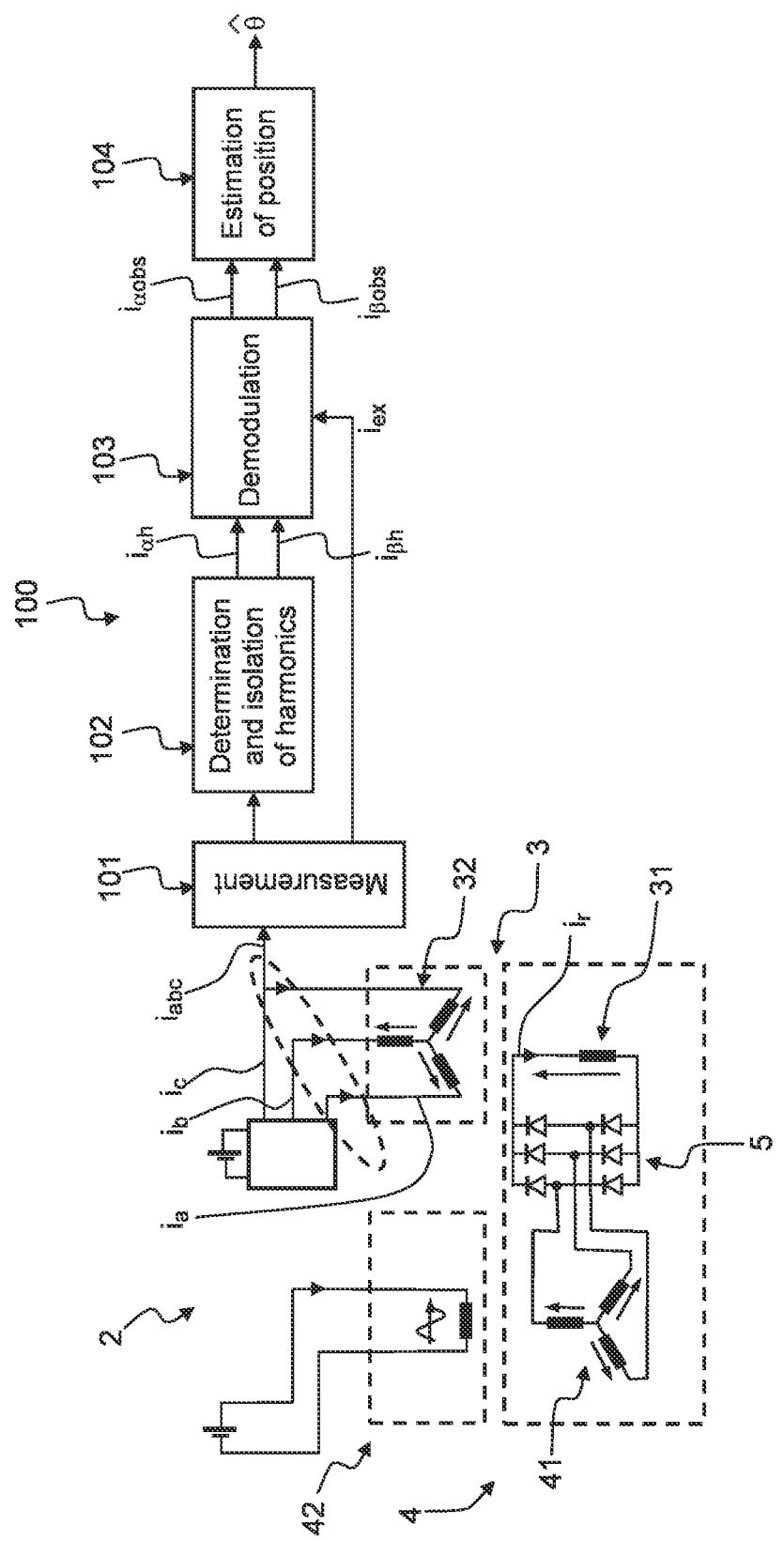
FIG. 1B represents the last two stages of a rotating electrical machine with multiple stages comprising a device for estimating the position of the rotor at low speed and when stopped.

FIG. 1A schematically represents a method for estimating 1 an estimated position $\hat{\theta}$ of a rotor 31 of a main machine 3 in the last two stages of a rotating electrical machine 2 composed of the main machine 3, an exciter 4 and an estimation device 100, represented in FIG. 1B, for estimating the position of a rotor of a synchronous electrical machine.

Figure 1C:
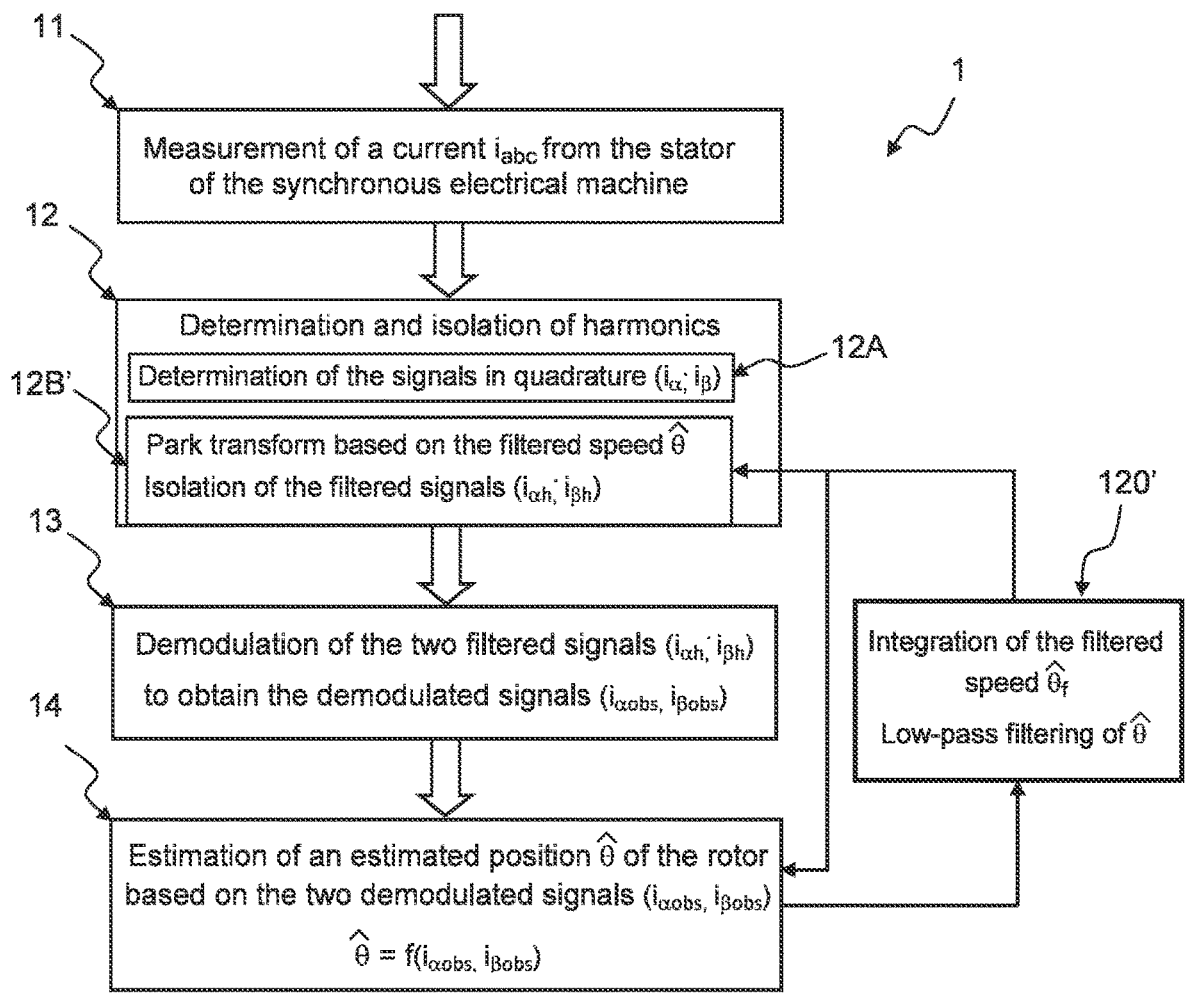
FIG. 1C schematically illustrates the method for estimating the position of a rotor of a rotating electrical machine according to a variant.

The method for estimating 1 the position of a rotor of a main machine measures a current $i_{abc}$ circulating on the stator 32 and a current $i_{ex}$ originating from an exciter 4 measured on a stator 42 of the exciter 4 which is a single-phase alternating current of constant frequency $f_{ex}$. The method for estimating 1 the position of a rotor of a synchronous electrical machine comprises the following four steps:

a step of measurement 11 of a current $i_{abc}$ circulating in the stator 32 of the main machine 3 and, possibly, of a current $i_{ex}$ originating from the exciter 4 at the stator 42. The current $i_{abc}$ is a three-phase current $i_a$, $i_b$, $i_c$ of the same frequency $f_e$ of the main machine 3 phase-shifted by 120 degrees. The measurement step 11 also makes it possible to eliminate the measurement noise at the same time as the current $i_{abc}$. Furthermore, it is possible to envisage, according to certain conditions, measuring only two phases of the stator current and deducing the third therefrom according to the phase law of three-phase currents:

$$i_a + i_b + i_c = 0$$

a step of determining and of isolation of harmonics 12 that makes it possible to obtain two filtered signals $i_{\alpha h}$; $i_{\beta h}$ from the current $i_{abc}$. The determination and isolation step 12 comprises steps of determination 12A of two signals in quadrature $i_\alpha$; $i_\beta$ from the current $i_{abc}$ of the stator 32 according to a stationary reference frame and of isolation 12B of the two signals in quadrature $i_\alpha$; $i_\beta$ in order to obtain two filtered signals $i_{\alpha h}$; $i_{\beta h}$. More specifically, the current $i_{abc}$ is transformed into a stationary reference frame $(\alpha,\beta)$ that allows a three-phase system to be modelled. Preferentially, the current $i_{abc}$ is transformed into the reference frame $(\alpha,\beta)$ by a Clarke transformation for the purposes of power conservation and can be transformed into the reference frame $(\alpha,\beta)$ by a Concordia transformation for the purpose of amplitude conservation. Advantageously, the polyphase machines, hexaphase for example, have equivalent transformations to a stationary reference frame, which make it possible to keep the invention applicable. The two signals are filtered in the isolation step 12B in order to isolate only the harmonics of interest. The two filtered signals obtained, which represent the image of the harmonics of interest for the person skilled in the art, are thus named $i_{\alpha h}$; $i_{\beta h}$. As an example, the isolation 12B of the two filtered signals $i_{\alpha h}$; $i_{\beta h}$ from the two signals in quadrature $i_\alpha$; $i_\beta$ can be performed using a bandpass filter or high-pass filter. Nevertheless, any means whose function is to eliminate the signals at low frequency in favour of the high-frequency signals and/or that makes it possible to eliminate all the disturbances originating from the environment of the main machine 3 can be taken into consideration in the isolation 12B of the two filtered signals $i_{\alpha h}$; $i_{\beta h}$. As an example, the use of a frequency transformation, such as the Park transformation, and a digital filtering in order to isolate the harmonics at a frequency which does not change in time despite the rotating of the machine, as represented in FIG. 1C, offers this function of elimination of the signals at low frequency in favour of the high-frequency signals.

Figure 4:
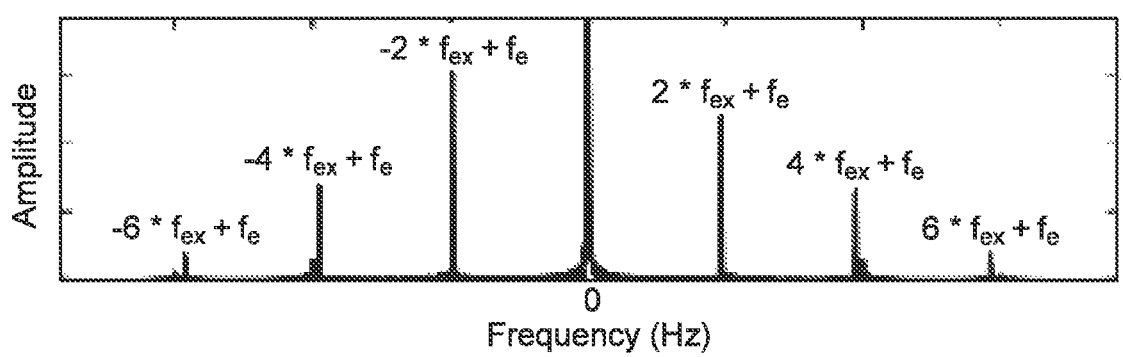
FIG. 4 is a harmonics spectrum of a signal $i_{\alpha h}$; $i_{\beta h}$ of the main machine when the rotor current contains a harmonic of high frequency, notably $f_{ex}$ in this application.

The two filtered signals $i_{\alpha h}$; $i_{\beta h}$ are advantageously signals or harmonics whose frequency combines the operating frequency $f_{ex}$ of the exciter 4 or of one of its multiples and the frequency $f_e$ of the main machine 3 as FIG. 4 shows. Preferentially, the two filtered signals $i_{\alpha h}$; $i_{\beta h}$ have a frequency of the form $f_e$ $^+_-$ $2*f_{ex}$. Nevertheless, it is possible to envisage using filtered signals with a differentiated form such as $f_e$ $^+_-$ $4*f_{ex}$ or even $f_e$ $^+_-$ $6*f_{ex}$. The two filtered signals $i_{\alpha h}$; $i_{\beta h}$ then form a pair of harmonics centred around the fundamental component. Thus, the two filtered signals $i_{\alpha h}$; $i_{\beta h}$ have a frequency which can be defined according to the following formula:

$$f_e \text{ }^+_- \text{ } n*f_{ex}$$

in which n represents an even relative integer number, that is to say the number of pairs of poles on the stator.

Figure 2A:
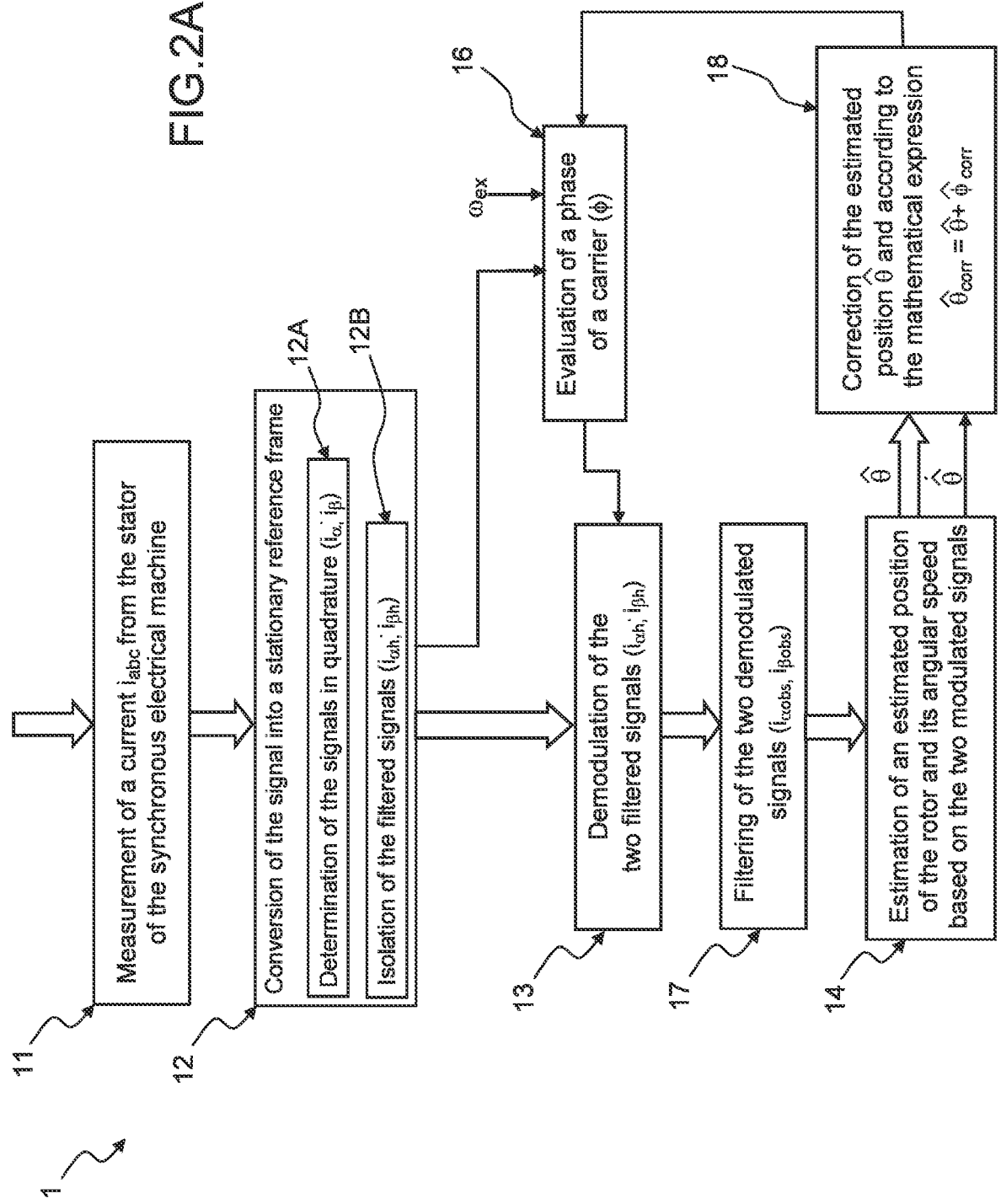
FIG. 2A schematically illustrates the estimation method in a more comprehensive version, that is to say comprising additional steps of processing of the signal for the estimation of the position of the rotor of a rotating electrical machine according to the invention.
Figure 2B:
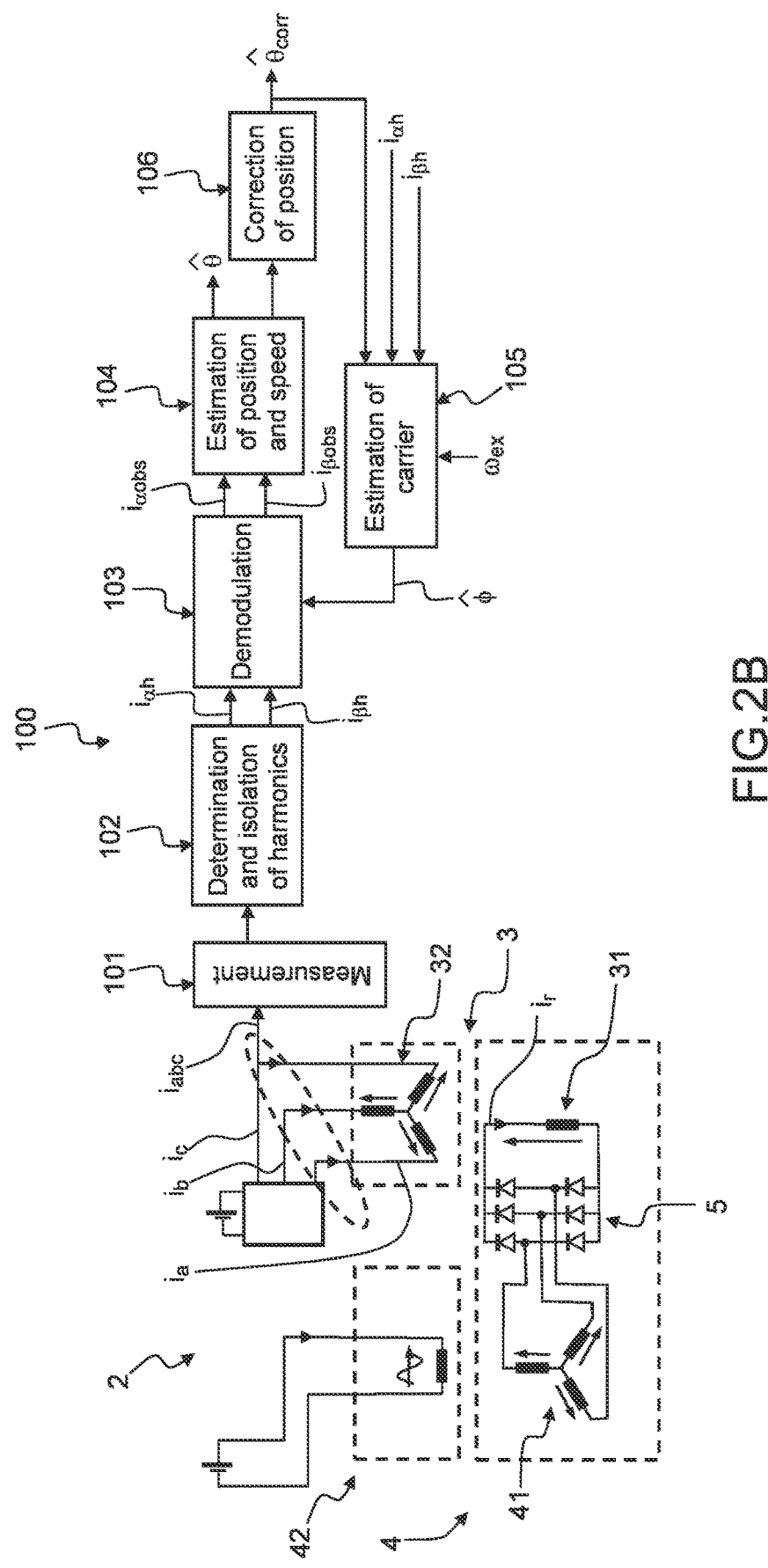
FIG. 2B represents the last two stages of a rotating electrical machine with multiple stages comprising a device for estimating the position of the rotor in a more comprehensive version, that is to say one comprising other signal processing modules concerning the position of the rotor of a rotating electrical machine according to the invention.

A step of demodulation 13 of the two filtered signals $i_{\alpha h}$; $i_{\beta h}$ in order to obtain two demodulated signals $i_{\alpha obs}$, $i_{\beta obs}$. In order to demodulate the two filtered signals $i_{\alpha h}$; $i_{\beta h}$, the demodulation step 13 uses, for example, a measurement of the current of the exciter $i_{ex}$ which can be determined on the stator 42 of the exciter 4 in the measurement step 11 or even an estimation of a carrier of angular frequency $\omega_{ex}$ of the exciter 4 as illustrated in FIGS. 2A and 2B.

More specifically, the two filtered signals $i_{\alpha h}$; $i_{\beta h}$ having an amplitude A, can be written in the form:

$$\begin{bmatrix} i_{\alpha h} \\ i_{\beta h} \end{bmatrix} \approx A \begin{bmatrix} \cos(\theta) \\ \sin(\theta) \end{bmatrix} \sin(2\omega_{ex}t + \phi) \quad (1)$$

With $\theta$ the real position of the rotor 31 of the main machine 3 and $\omega_{ex} = 2\pi f_{ex}$ the angular frequency of the current of the exciter 4. With $\phi$, the phase of the harmonic of the current induced on the rotor 31, a harmonic that will be called carrier.

The observed demodulation consists in eliminating the term $\sin(2\omega_{ex}t + \phi)$ from the Equation (1).

One way of producing the demodulation consists in multiplying the Equation (1) by a signal which emulates the signal of the carrier. This signal must have the frequency and the phase of the carrier. Now, in knowing that the carrier cannot be measured, the signal can be reconstructed from the measurement of the current of the exciter $i_{ex}$. An example of simple processing of the excitation current for reconstruction of the carrier can be:

$$\sin(2\omega_{ex}t + \hat{\phi}) \approx \frac{4|i_{ex}|}{I_{ex}} - 1$$

With $I_{ex}$ the "peak to peak" amplitude of the excitation current and $\hat{\phi}$ the approximate phase of the carrier thus obtained.

In order to allow the person skilled in the art to more accurately control the phase $\phi$ of the carrier, other solutions can be envisaged, such as, for example, the use of an observer that takes account of the dynamics of a rectifier 5, represented in FIG. 1B, making it possible to obtain a direct current from an alternating current and of the circuit of the rotor 31 of the main machine 3, represented in FIG. 1B.

Another filtering of the two demodulated signals $i_{\alpha obs}$, $i_{\beta obs}$, representing the two filtered signals $i_{\alpha h}$; $i_{\beta h}$ after having been demodulated, called $H_F(s)$ is then applied in order to obtain only the low-frequency information. The following formula is then obtained for the two demodulated signals $i_{\alpha obs}$, $i_{\beta obs}$:

$$\begin{bmatrix} i_{\alpha obs} \\ i_{\beta obs} \end{bmatrix} = H_F(s) \left( 2 \begin{bmatrix} i_{\alpha h} \\ i_{\beta h} \end{bmatrix} \sin(2\omega_{ex}t + \hat{\phi}) \right) \quad (2)$$

The signal to be filtered in the Equation (2) can then be developed using the formula (1) as follows:

$$\begin{bmatrix} i_{\alpha h} \\ i_{\beta h} \end{bmatrix} \sin(2\omega_{ex}t + \hat{\phi}) = A \begin{bmatrix} \cos(\theta) \\ \sin(\theta) \end{bmatrix} \sin(2\omega_{ex}t + \phi)\sin(2\omega_{ex}t + \hat{\phi}) \quad (3)$$

Thus, through the trigonometrical formulae, it is possible to reveal the low-frequency component which is obtained following the filtering in the Equation (2):

$$\begin{bmatrix} i_{\alpha h} \\ i_{\beta h} \end{bmatrix} \sin(2\omega_{ex}t + \hat{\phi}) = \frac{A}{2} \begin{bmatrix} \cos(\theta) \\ \sin(\theta) \end{bmatrix} (\sin(\phi - \hat{\phi}) - \cos(4\omega_{ex}t + \phi + \hat{\phi})) \quad (4)$$

Now, as stated previously, with the approximate phase $\hat{\phi}$ making it possible theoretically to compensate the phase $\phi$ present in the estimated carrier, the sine of their difference is ideally equivalent to $\sin(\phi-\hat{\phi}) \approx \sin(0)=1$.

Thus, the formula (4) then becomes:

$$\begin{bmatrix} i_{\alpha h} \\ i_{\beta h} \end{bmatrix} \sin(2\omega_{ex}t + \hat{\phi}) = \frac{A}{2} \begin{bmatrix} \cos(\theta) \\ \sin(\theta) \end{bmatrix} (1 - \cos(4\omega_{ex}t + \phi + \hat{\phi})) \quad (5)$$

This way, it is possible to obtain the two demodulated signals $i_{\alpha obs}$, $i_{\beta obs}$ from the formulae (5) and (2) by applying a filtering, such as, for example, a low-pass filter, synonymous with the information on the real position θ of the rotor 31 of the main machine 3:

$$\begin{bmatrix} i_{\alpha obs} \\ i_{\beta obs} \end{bmatrix} = H_F(s)\left(2\begin{bmatrix} i_{\alpha h} \\ i_{\beta h} \end{bmatrix} \sin(2\omega_{ex}t + \hat{\phi})\right) \approx A \begin{bmatrix} \cos(\theta) \\ \sin(\theta) \end{bmatrix} \quad (6)$$

The two demodulated signals $i_{\alpha obs}$, $i_{\beta obs}$ are therefore new representations of the two filtered signals $i_{\alpha h}$; $i_{\beta h}$ without their high-frequency modulation.

A step of obtaining 14 of an estimated position $\hat{\theta}$ of the rotor 31 of the main machine 3 from the two demodulated signals $i_{\alpha obs}$, $i_{\beta obs}$ generated in the demodulation step 13. The obtaining step 14 makes it possible to determine an estimated position from the two demodulated signals $i_{\alpha obs}$, $i_{\beta obs}$, denoted $\hat{\theta}$. As an example, the estimated position $\hat{\theta}$ estimated in the obtaining step 14 is made according to the following mathematical expression:

$$\hat{\theta} = \mathrm{atan}\left(\frac{i_{\beta obs}}{i_{\alpha obs}}\right) \quad (7)$$

After having estimated the estimated position $\hat{\theta}$ of the rotor 31 of the main machine 3, the estimation method 1 can also comprise a step of estimation of a speed $\hat{\dot{\theta}}$ of the rotor 31 of the main machine 3, combined in the step of obtaining 14 of the estimated position $\hat{\theta}$. The speed $\hat{\dot{\theta}}$ of the rotor 31 is the temporal derivative of the estimated position $\hat{\theta}$ of the rotor 31.

According to another configuration, the estimated position $\hat{\theta}$ estimated in the obtaining step 14 can be produced using a phase-locked loop or an observer, for example an observer of Luenberger type, for example taking account of the mechanical model of the machine. These algorithms minimise the estimation deviation between the estimated position $\hat{\theta}$, in the preceding iteration step, and the real position θ. This estimation deviation is obtained from the demodulated signals $i_{\alpha obs}$, $i_{\beta obs}$ and the estimated position $\hat{\theta}$ obtained at the preceding instant. These algorithms can advantageously be used for the estimation of the speed $\hat{\dot{\theta}}$ in addition to the obtaining of the estimated position $\hat{\theta}$ of the rotor 31.

In automatic mode, an observer or stator observer is an extension of a model represented in state representation form, that is to say a dynamic system, via parameters called state variables. By definition, an observer makes it possible to reconstruct the state of the model observed from the dynamic system and the measurements of other quantities. This representation makes it possible to determine the state of the system at any future instant by knowing the state at the initial instant and the behaviour of the state variables. Thus, it is possible to envisage using, instead of the mathematical expression (7), an observer, and advantageously an observer of Luenberger type, in which the state variables include the position and the speed of the system. Advantageously, the model can consider the dynamics of the resisting torque or of other mechanical parameters measured by or known to the user. The method for estimating 1 the position of the rotor 31 is an iterative method, that is to say that the estimation method 1 can be repeated periodically. The four successive steps of measurement 11 of the current $i_{abc}$, of determination and of isolation of harmonics 12, of demodulation 13 of the two filtered signals $i_{\alpha h}$; $i_{\beta h}$ and of obtaining 14 of the estimated position $\hat{\theta}$ can therefore be iterated multiple times so as to refine the estimated position $\hat{\theta}$ and reduce any error between the real position and the estimated position $\hat{\theta}$ of the rotor 31 of the main machine 3.

FIG. 1B schematically represents the last two stages of the rotating electrical machine 2 composed of the main machine 3, the exciter 4 coupled to the main machine 3 via a revolving three-phase rectifier 5 and an estimation device 100 for operation when stopped or at low speed. The device for estimating the position of the rotor 31 of the main machine 3 is composed of four modules mirroring the four steps of the estimation method 1.

A measurement module 101, conditioning the measurement step 11, capable of measuring the current $i_{abc}$ originating from the stator 32 of the main machine 3 and, possibly, capable of measuring the current $i_{ex}$ originating from the stator 42 of the exciter 4. Also, the measurement module 101 also makes it possible to eliminate the measured noise at the same time as the current $i_{abc}$.

A module for determining and isolating harmonics 102 making it possible to condition the step of determination and of isolation of harmonics 12 presented previously. The module for determining and isolating harmonics 102 generates two filtered signals $i_{\alpha h}$; $i_{\beta h}$ from the noiseless current $i_{abc}$ obtained from the measurement module 101. More specifically, the module for determining and isolating harmonics 102 makes it possible to transform current $i_{abc}$ into the stationary reference frame (α, β) by any transformation that makes it possible to model a three-phase system, such as, for example, a Clarke transformation or a Concordia transformation.

A module for demodulating 103 the two filtered signals $i_{\alpha h}$; $i_{\beta h}$, making it possible to obtain two demodulated signals $i_{\alpha obs}$, $i_{\beta obs}$, conditions the demodulation step 13. The module for demodulating 103 the two filtered signals $i_{\alpha h}$, $i_{\beta h}$ is capable of collecting the measurement of the current $i_{ex}$ of the stator 42 of the exciter 4 picked up by the measurement module 101 in order to generate the two demodulated signals $i_{\alpha obs}$, $i_{\beta obs}$ representing the information on the real position 9 of the rotor 31 of the main machine 3.

The two demodulated signals $i_{\alpha obs}$, $i_{\beta obs}$ are then recovered by a module for obtaining 104 the estimated position $\hat{\theta}$ of the rotor 31 of the main machine 3. The obtaining module 104 conditions the step of obtaining 14 of the estimated position $\hat{\theta}$ of the rotor 31 of the main machine 3. Thus, the module for obtaining 104 the estimated position $\hat{\theta}$ is configured to determine, from the two demodulated signals $i_{\alpha obs}$, $i_{\beta obs}$, the estimated position $\hat{\theta}$ of the rotor 31 according to several means.

Thus, by way of example, the estimated position $\hat{\theta}$ of the rotor 31 of the main machine 3 can be generated by the obtaining module 104 according to the mathematical expression (7):

$$\hat{\theta} = \mathrm{atan}\left(\frac{i_{\beta obs}}{i_{\alpha obs}}\right) \quad (7)$$

Nevertheless, it is possible to envisage incorporating other algorithms or procedures in the obtaining module 104 making it possible to determine the estimated position $\hat{\theta}$, such as, for example, the use of a phase locking algorithm or of the observer (not represented) presented previously in FIG. 1A, for example of Luenberger type taking into account the mechanical model of the machine.

Using these four steps comprising the step of measurement 11 of the current $i_{abc}$ conditioned by the measurement model 101, the step of determination and of isolation of harmonics 12 conditioned by the module for determining and isolating harmonics 102, the step of demodulation 13 of the two filtered signals $i_{\alpha h}$; $i_{\beta h}$ conditioned by the demodulation module 103 and the step of obtaining 14 of the estimated position $\hat{\theta}$ conditioned by the module for obtaining 104 the estimated position $\hat{\theta}$, it is possible to determine the position of the rotor 31 of the main machine 3, and the speed.

As a variant, the step of determination and of isolation of harmonics 12 can include, in place of the step 12B of isolation of the two signals in quadrature $i_\alpha$; $i_\beta$ an isolation step with anticipative, or feedforward, action 12B', represented in FIG. 1C, allowing the isolation of the two filtered signals $i_{\alpha h}$; $i_{\beta h}$ while inducing a change of frequency of the harmonics of interest. The isolation step with feedforward action 12B' is preceded by a step 120' allowing the processing of the current estimated speed $\hat{\dot{\theta}}$ by the method. It should be noted that the estimated speed $\hat{\dot{\theta}}$ corresponds to an estimation of the electrical frequency of the machine denoted $f_e$. In the case where this estimation of the speed $\hat{\dot{\theta}}$ is not without noise, any means whose function is to eliminate high-frequency variations on the estimated speed $\hat{\dot{\theta}}$ can be taken into consideration in the step 120'. As an example, a low-pass filtering of the speed $\hat{\dot{\theta}}$ making it possible to obtain an estimated filtered speed, denoted $\hat{\dot{\theta}}_f$, accompanied by an integrator in order to obtain the phase of the filtered speed $\hat{\theta}_f$, following the low-pass filtering, may be put in place in the step 120':

$$\hat{\theta}_f = \int \hat{\dot{\theta}}_f dt$$

The feedforward use of the speed $\hat{\dot{\theta}}$ offers the advantage of ensuring a better conditioning of the signals in quadrature $i_\alpha$; $i_\beta$ before the isolation thereof. Consequently, the feedforward action in the step 12B' allows a transformation of the two signals in quadrature $i_\alpha$; $i_\beta$ into filtered signals $i_{\alpha h}$; $i_{\beta h}$ from the phase of the filtered speed $\hat{\theta}_f$. As an indicative example, this transformation is a Park transformation using the phase of the filtered speed $\hat{\theta}_f$ determined in the step 120'. Unlike the Concordia transformation or the Clarke transformation, the Park transformation offers the benefit of allowing a centring of the frequency of the harmonics by eliminating the term linked to the frequency $f_e$ of the main machine 3 if it is considered that $(f_e - \hat{\dot{\theta}}_f) \approx 0$. Thus, the two filtered signals $i_{\alpha h}$; $i_{\beta h}$ in the isolation step with feedforward action 12B' form a pair of harmonics centred around the fundamental moment whose frequency, freed of the phase-shift linked to the frequency $f_e$ of the main machine 3, becomes:

$$-^+ n^* f_{ex}$$

The phase of the filtered speed $\hat{\theta}_f$ obtained in the step 120' is then used in the step of obtaining 14 of the estimated position $\hat{\theta}$ in order to preserve the accuracy of the estimation which is then expressed, as an indicative example, according to the following formula:

$$\hat{\theta} = f(i_{\alpha obs}, i_{\beta obs}) + \hat{\theta}_f$$

In which $\hat{\theta}_f$ represents the integration of the filtered speed $\hat{\dot{\theta}}_f$.

As a preferential example, the obtaining step 14 is performed according to the following mathematical expression:

$$\hat{\theta} = \mathrm{atan}\left(\frac{i_{\beta obs}}{i_{\alpha obs}}\right) + \hat{\theta}_f$$

However, there may be some approximations, such as, for example, in the phase of the carrier of the rotor 31 of the main machine 3 or even for the phase-shifting introduced in the filtering steps during the demodulation 13 of the high-frequency signals.

Thus, other steps, illustrated in FIG. 2A can be added in order to eliminate the uncertainties cited.

FIG. 2A schematically represents the estimation method 1 in its most comprehensive version, that is to say the estimation method 1 illustrated by FIG. 1A in which additional steps have been added. Thus, the estimation method 1, according to FIG. 2A, comprises the four steps of measurement 11 of the current $i_{abc}$, of determination and isolation of harmonics 12, of demodulation 13 of the two filtered signals $i_{\alpha h}$; $i_{\beta h}$ and of obtaining 14 of the estimated position $\hat{\theta}$ adopting new configurations:

In place of the measurement of the current $i_{ex}$ allowing the reconstruction of the carrier, a direct estimation of a phase $\hat{\phi}$ of the carrier by knowing the angular frequency $\omega_{ex}$ of the exciter 4 can be envisaged. This phase $\hat{\phi}$ of the carrier makes it possible to dispense with the measurement of the current $i_{ex}$ of the exciter 4 while allowing a better knowledge of the phase of the carrier. In fact, the estimation method 1 and the estimation device 100 are preferentially associated with a rotating electrical machine with three stages. However, through the use of the estimation of the phase $\hat{\phi}$ of the carrier in place of the measurement of the current $i_{ex}$ of the exciter 4, the estimation method 1 and the estimation device 100 can be associated with a rotating electrical machine with a single stage or more than two stages. In fact, in order to best predict the position of the rotor 31 of the main machine 3, the phase $\hat{\phi}$ of the carrier must be known with accuracy. Thus, an additional step of evaluation 16 of the phase $\hat{\phi}$ of the carrier can be introduced into the estimation method 1. More specifically, the demodulation step 13 is preceded by the step of evaluation 16 of the phase $\hat{\phi}$ of the carrier. This step of evaluation 16 of the phase $\hat{\phi}$ of the carrier is illustrated hereinbelow in FIG. 2C. This phase $\hat{\phi}$ of the carrier is estimated from the angular frequency $\omega_{ex}$ of the exciter 4, from the estimated position $\hat{\theta}$ estimated in a preceding iteration of the estimation method 1 and from the filtered signals $i_{\alpha_h}$, $i_{\beta_h}$ filtered in the step of determination and of isolation of harmonics 12. The carrier can be considered as a high-frequency harmonic obtained on the rotor 41 of the exciter 4.

Thus, the demodulation step 13 then receives as input the filtered signals $i_{\alpha_h}$, $i_{\beta_h}$ more specifically containing the information on the position of the rotor 31 and the phase $\hat{\phi}$ of the carrier pre-estimated upstream. And, the demodulation step 13 can dispense with the measurement of the current $i_{ex}$ of the exciter 4.

In theory, the demodulation step 13 makes it possible to obtain two ideal demodulated signals $i_{\alpha obs}$, $i_{\beta obs}$, that is to say signals completely refined and usable to determine the estimated position $\hat{\theta}$ of the rotor 31 of the main machine 3. However, experience tends to prove that the direct use of the mathematical formula (7) making it possible to obtain the estimated position $\hat{\theta}$ on the two demodulated signals $i_{\alpha obs}$, $i_{\beta obs}$ contains imperfections and can provoke instability when the position obtained with the estimation method 1 is used in the control of the machine. In order to reduce the noise following the demodulation step 13, a filtering step 17 can be put in place. This filtering step 17 requires as input the two demodulated signals $i_{\alpha obs}$, $i_{\beta obs}$ and makes it possible to reconstruct a sinusoidal form for the two demodulated signals $i_{\alpha obs}$, $i_{\beta obs}$. Thus, the filtering step 17 is positioned between the demodulation step 13 and the step of obtaining 14 the estimated position. The filtering step 17 makes it possible to obtain pure demodulated signals $i_{\alpha obs}$, $i_{\alpha obs}$, that is to say signals reconstructed from the two demodulated signals $i_{\alpha obs}$, $i_{\beta obs}$ stripped of all the undesirable effects such as, for example, the noise induced by zero transition of the phase currents. As an example, this filtering step 17 can be performed using an adaptive bandpass filter taking into account electrical frequency information of the machine, or it can advantageously be performed using an extended Kalman filter considering their model with the properties of the signals in quadrature. The Kalman filter can advantageously be used also for the estimation of the speed.

With the disturbances eliminated, the mathematical formula (7) defined previously can be used on the new demodulated and filtered signals $i_{\alpha obs}$, $i_{\beta obs}$ refined in the step of obtaining 14 of the estimated position $\hat{\theta}$ of the rotor 31 of the main machine 3. Nevertheless, the method for estimating 1 the estimated position $\hat{\theta}$ introduce a series of phase-shifts on the estimated position $\hat{\theta}$ for each filter used. For example, any filtering applied following the demodulation step 13 induces a phase shift which cannot be disregarded in the estimation method 1 because it is transferred automatically to the estimated position $\hat{\theta}$. To be robust, the estimation method 1 can comprise a step of correction 18 of the estimated position $\hat{\theta}$. This correction step 18 is applied following the step of obtaining 14 of the estimated position $\hat{\theta}$ of the rotor 31 of the main machine 3 in order to correct the induced phase shift. The estimated position $\hat{\theta}$ is then corrected in the correction step 18 with the following mathematical formula:

$$\hat{\theta}_{corr} = \hat{\theta} + \hat{\phi}_{corr}$$

In which $\hat{\theta}_{corr}$ is the corrected position of the rotor 31 of the main machine 3 and $\hat{\phi}_{corr}$ is a correction of the delays on the estimation of the position of the rotor 31 making it possible to align the estimated position $\hat{\theta}$ with the real position of the rotor 31 of the main machine 3.

Furthermore, the correction of the delays $\hat{\phi}_{corr}$ is, in reality, a sum of several corrections considered:

A correction of the phase shifting of the filters used induced in the demodulation 13, denoted $\hat{\phi}_F(\hat{\omega}_e)$. In fact, the two demodulated signals $i_{\alpha obs}$, $i_{\beta obs}$ are generally delayed by the effect of the filtering. This then affects the phase of the estimated position $\hat{\theta}$ of the rotor 31 of the main machine 3. Thus, in order to rectify that, this phase shift is calculated automatically and in real time as a function of the speed $\hat{\dot{\theta}}$ of the main machine 3.

A correction of phase shift dependent on the electromagnetic characteristics of the synchronous electrical machine $\hat{\phi}_{lc}$ induced by the phenomenon of electromagnetic saturation and/or of variation of the impedance of the stator circuit with temperature. In fact, each rotating electrical machine being defined by its own architecture, it then comprises nonlinearity effects specific thereto. That makes it possible, for two rotating electrical machines having an identical mode of operation, for the deviations between the real position and the estimated position to be noted. The phase shift correction dependent on the electromagnetic characteristics of the synchronous electrical machine $\hat{\phi}_{lc}$ is therefore specific to each rotating electrical machine provided with the estimation device 100 and/or the method for estimating 1 the position of the rotor 31 and is put in place empirically for example or then by simulation and/or estimation when the estimation method 1 is put in place. Thus, the correction of the delays $\hat{\phi}_{corr}$ can be defined as:

$$\hat{\phi}_{corr} = \hat{\phi}_F(\hat{\omega}_e) + \hat{\phi}_{lc}$$

FIG. 2B represents the last two stages of the rotating electrical machine 2 provided with the estimation device 100 described in FIG. 1B in its most comprehensive version, that is to say comprising additional modules that make it possible to condition the comprehensive estimation method 1 described previously in FIG. 2A.

As indicated in FIG. 1B, the estimation device 100 comprises the module for measuring 101 the current $i_{abc}$ originating from the stator 32 of the main machine 3, the module for determining and isolating harmonics 102 of the two filtered signals $i_{\alpha h}$; $i_{\beta h}$ from the current $i_{abc}$, from the module for demodulating 103 the two filtered signals $i_{\alpha h}$; $i_{\beta h}$ and from the module for obtaining 104 the estimated position $\hat{\theta}$ of the rotor 31.

Following the estimation of the estimated position $\hat{\theta}$ and of the speed $\hat{\dot{\theta}}$ of the rotor 31, a module for correcting 106 the estimated position $\hat{\theta}$ can be introduced. This correction module 106, which conditions the step of correction 18 of the estimated position $\hat{\theta}$, makes it possible to evaluate the corrected position $\hat{\theta}_{corr}$, which provides a more accurate estimation of the position of the rotor 31 of the main machine 3.

The estimation device 100 also comprises a module for estimating 105 the phase $\hat{\phi}$ of the carrier. In order to estimate the phase $\hat{\phi}$, the estimation module 105 requires the corrected position $\hat{\theta}_{corr}$ from the preceding iteration and the two filtered signals $i_{\alpha h}$, $i_{\beta h}$ and the angular frequency $\omega_{ex}$ of the exciter 4. Through the use of these three parameters, the estimation module 105 supplies the phase $\hat{\phi}$ of the carrier to the demodulation module 103. Nevertheless, it is possible to envisage replacing the estimated position $\hat{\theta}$ in place of the corrected position $\hat{\theta}_{corr}$ in the case of absence of a step of correction 18 of the estimated position $\hat{\theta}$.

The demodulation module 103 then collects the phase $\hat{\phi}$ evaluated by the estimation module 105 and the two signals $i_{\alpha h}$; $i_{\beta h}$ determined by the module for determining and isolating harmonics 102, thus making it possible to dispense with the measurement of the current $i_{ex}$ of the stator 42 of the exciter 4. Thus, the module for demodulating 103 the two filtered signals $i_{\alpha h}$; $i_{\beta h}$ also makes it possible to obtain the two demodulated signals $i_{\alpha obs}$, $i_{\beta obs}$ from the carrier of angular frequency $\omega_{ex}$ of the exciter 4.

That allows an electrical machine comprising the exciter 4 and at least one main machine 3 to be equipped with the estimation device 100 in order to obtain the estimated position $\hat{\theta}$ or the corrected position $\hat{\theta}_{corr}$.

Figure 2C:
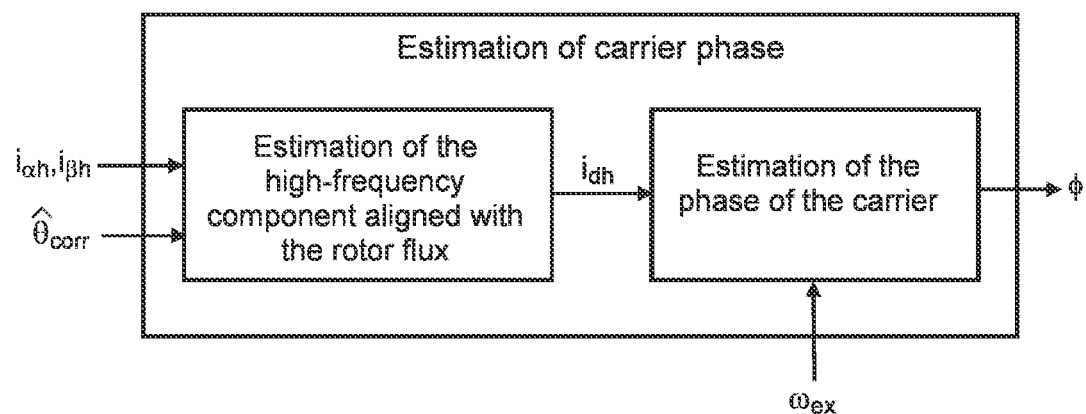
FIG. 2C schematically illustrates a step of evaluation 16 of the phase of a carrier schematically represented in FIG. 2B.

FIG. 2C schematically represents the step of evaluation 16 of the phase $\hat{\phi}$ of the carrier in order to allow the demodulation step 13 to be put in place.

In the state of the art, the evaluation of a phase $\hat{\phi}$ of a carrier is done generally using the current measured at the rotor 31. However, this involves the use of an additional sensor in the rotor 31, which is not possible in the context of a machine with multiple stages where the rotor current is not accessible.

In order to best evaluate the phase $\hat{\phi}$ of a carrier without measuring the excitation current at the stator 41 of the exciter 4, the two filtered signals $i_{\alpha h}$, $i_{\beta h}$, the angular frequency $\omega_{ex}$ of the control of the exciter 4 and the estimated position $\hat{\theta}$ of the rotor 31 of the main machine 3 are necessary. Advantageously, the estimated position $\hat{\theta}$ can be replaced by the corrected position $\hat{\theta}_{corr}$ if this position is available in the estimation method 1.

As illustrated in FIG. 2C, before evaluating the phase $\hat{\phi}$, a signal $i_{d_h}$ is obtained by using the properties of the Clarke or Concordia transform combining the estimated position $\hat{\theta}$ of the rotor 31 and the two filtered signals $i_{\alpha h}$, $i_{\beta h}$. The signal $i_{d_h}$ obtained is an estimation of the high-frequency component aligned with the flux of the rotor 31 of the main machine 3.

The signal $i_{d_h}$ obtained is an image of the carrier having the frequency and the phase of the signal induced on the stator 32 of the main machine 3. It is sufficient to determine the phase of the signal at the frequency of interest, in a preferential case $2\omega_{ex}$, to obtain the phase $\hat{\phi}$.

Figure 3:
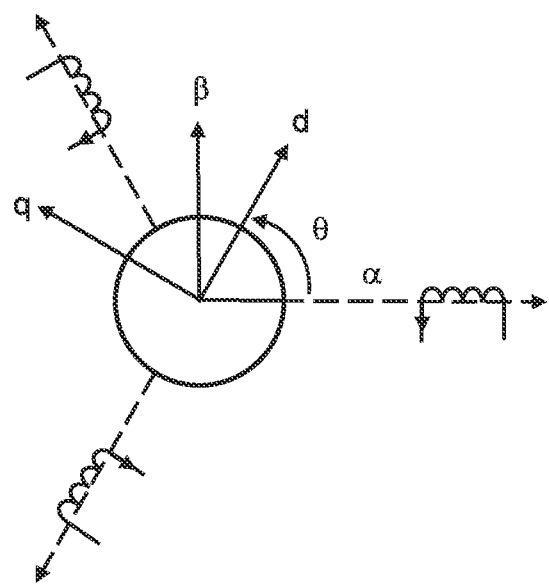
FIG. 3 represents the equivalent reference frames of representation of a current $i_{abc}$ by using the Concordia or Clarke transformations to a stationary reference frame ($\alpha,\beta$) allowing conservation of the power and of the amplitude respectively.

FIG. 3 represents the possible transformations of the current $i_{abc}$ to a revolving reference frame or a stationary reference frame. The revolving reference frame is defined by a first revolving axis d (direct) and a second revolving axis q (quadrature) centred at the intersection of the three-phase current $i_a$, $i_b$, $i_c$. As the name of the reference frame indicates, the first revolving axis d and the second revolving axis q undergo an angular variation linked to the position $\theta$ used for the transformation. A transformation in a stationary reference frame composed of a first fixed axis $\alpha$ and a second fixed axis $\beta$ is performed, as stated previously, using the Clarke transformation or the Concordia transformation. By virtue of this conversion, the current $i_{abc}$ can be defined by a component on the first fixed axis $\alpha$ and by another component on the second fixed axis $\beta$, that is to say the two signals in quadrature $i_\alpha$; $i_\beta$. Moreover, it is possible to envisage using other types of transformation to a stationary reference frame. Consequently, another stationary reference frame could be obtained with other pairs of signals in quadrature.

Through this conversion, it is possible to obtain the spectrum of the current $i_{\alpha\beta}$ of the main machine 3 as represented in FIG. 4. The spectrum of the current makes it possible to illustrate the main harmonics of the signals in quadrature $i_\alpha$; $i_\beta$.

As stated previously, the frequency of the main harmonics is a combination of the operating frequency $f_{ex}$ of the exciter 4 or of one of its multiples and of the frequency $f_e$ of the main machine 3. Thus, the harmonics can have a frequency of the form $f_{e\_}{}^+2{}^*f_{ex}$ or of the form $f_{e\_}{}^+4{}^*f_{ex}$, or even of the form $f_{e\_}{}^+6{}^*f_{ex}$.

The invention claimed is:

1. A method for estimating the position of a rotor of a synchronous electrical machine without the injection of signals, comprising a rotor and a stator coupled to an inverted synchronous electrical machine, acting as exciter, via a rectifier, the rectifier being connected to the stator of the inverted synchronous electrical machine and to the rotor excitation of the main machine, the estimation method comprising the following steps:

a. measurement of a current $i_{abc}$ circulating in the stator of the synchronous electrical machine;
 b. determination of two signals in quadrature $i_\alpha$; $i_\beta$ according to a stationary reference frame from the current $i_{abc}$ and isolation of two filtered signals $i_{\alpha h}$; $i_{\beta h}$ from the two signals in quadrature $i_\alpha$; $i_\beta$;
 c. demodulation of the two filtered signals $i_{\alpha h}$; $i_{\beta h}$ in order to obtain two demodulated signals $i_{\alpha obs}$, $i_{\beta obs}$, the step of demodulation of the two filtered signals $i_{\alpha h}$; $i_{\beta h}$ using a measurement of a current $i_{ex}$ of the stator of the inverted synchronous electrical machine;
 d. obtaining of an estimated position $\hat{\theta}$ of the rotor from the two demodulated signals $i_{\alpha obs}$, $i_{\beta obs}$.

2. The estimation method according to claim 1, wherein the estimated position $\hat{\theta}$ estimated in the step d is made according to the following mathematical expression:

$$\hat{\theta} = \mathrm{atan}\left(\frac{i_{\beta obs}}{i_{\alpha obs}}\right).$$

3. The estimation method according to claim 2, comprising a step of estimation of the speed $\hat{\dot{\theta}}$ of the rotor of the synchronous electrical machine from the estimated position $\hat{\theta}$ of the rotor of the synchronous electrical machine.

4. The estimation method according to claim 3, comprising a step of isolation with anticipative action of the two filtered signals $i_{\alpha h}$; $i_{\beta h}$ from the two signals in quadrature $i_\alpha$; $i_\beta$ and a phase of a filtered speed $\hat{\dot{\theta}}_f$ of the rotor, the filtered speed $\hat{\dot{\theta}}_f$ of the rotor representing the speed $\hat{\dot{\theta}}$ of the rotor when filtered.

5. The estimation method according to claim 1, wherein the estimated position $\hat{\theta}$ estimated in the step d is done using an observer.

6. The estimation method according to claim 1, wherein the two filtered signals $i_{\alpha h}$; $i_{\beta h}$ have a frequency combining an operating frequency $f_{ex}$ of the inverted synchronous electrical machine and a frequency $f_e$ of the synchronous electrical machine according to the following formula:

$$f_{e\_}{}^+n{}^*f_{ex}$$

wherein n represents an even relative integer number.

7. The estimation method according to claim 1, wherein the isolation of the two filtered signals $i_{\alpha h}$; $i_{\beta h}$ from the two signals in quadrature $i_\alpha$; $i_\beta$ is performed using a bandpass filter or a high-pass filter.

8. The estimation method according to claim 1, comprising a step of filtering of the two demodulated signals $i_{\alpha obs}$, $i_{\beta obs}$ between the step c and the step d, the filtering step being performed using a bandpass filter or an extended Kalman filter.

9. The estimation method according to claim 1, comprising a step of correction of the estimated position $\hat{\theta}$ with the following mathematical formula:

$$\hat{\theta}_{corr} = \hat{\theta} + \hat{\phi}_{corr}$$

wherein $\hat{\phi}_{corr}$ is a correction of the delays on the estimation of the position and $\hat{\theta}_{corr}$ is a corrected position of the rotor of the synchronous electrical machine.

10. The estimation method according to claim 9, wherein the correction of the delays $\hat{\phi}_{corr}$ is the sum of a phase-shift correction of the filters used $\hat{\phi}_F$ in the estimation method and of a phase-shift correction dependent on the electromagnetic characteristics of the synchronous electrical machine $\hat{\phi}_{LC}$.

11. The estimation method according to claim 1, the estimation method being able to be repeated periodically, wherein the demodulation step is preceded by a step of evaluation of a phase $\hat{\phi}$ of a carrier from the filtered signals $i_{\alpha_h}$; $i_{\beta_h}$, of an angular frequency $\omega_{ex}$ of the inverted synchronous electrical machine and of the estimated position $\hat{\theta}$ in a preceding iteration of the estimation method, the carrier being obtained at the rotor of the inverted synchronous electrical machine.

12. A device for estimating the position of a rotor of a synchronous electrical machine coupled to an inverted synchronous electrical machine via a rectifier for operation when stopped or at low speed according to one of the preceding claims, comprising:

a) a module for measuring a current $i_{abc}$ circulating in the stator of the synchronous electrical machine;
b) a module for determining and isolating harmonics of two filtered signals $i_{\alpha_h}$; $i_{\beta_h}$ from the current $i_{abc}$;
c) a module for demodulating the two filtered signals $i_{\alpha_h}$; $i_{\beta_h}$ from a measurement of the current $i_{ex}$ of the stator of the inverted synchronous electrical machine or of a carrier of angular frequency $\omega_{ex}$ of the inverted synchronous electrical machine in order to obtain two demodulated signals $i_{\alpha obs}$, $i_{\beta obs}$;
d) an obtaining module configured to determine an estimated position $\hat{\theta}$ of the rotor of the synchronous electrical machine from the two demodulated signals $i_{\alpha obs}$, $i_{\beta obs}$.

13. An electrical machine comprising an inverted electrical machine and at least one synchronous electrical machine equipped with the estimation device according to claim 12.

* * * * *